United States Patent [19]

Min et al.

[11] Patent Number: 5,155,700
[45] Date of Patent: Oct. 13, 1992

[54] METHOD FOR REDUCING COUPLING NOISE OF WORD LINES IN A SEMICONDUCTOR MEMORY DEVICE

[75] Inventors: Dong-Sun Min; Su-In Cho; Dae-Je Jin, all of Seoul, Rep. of Korea

[73] Assignee: Samsung Electronics Co., Ltd., Suwon, Rep. of Korea

[21] Appl. No.: 488,740

[22] Filed: Feb. 28, 1990

[30] Foreign Application Priority Data

Dec. 29, 1989 [KR] Rep. of Korea ............ 1989-20102

[51] Int. Cl.⁵ ............................................. G11C 7/00
[52] U.S. Cl. ..................................... 365/63; 365/206
[58] Field of Search ................ 365/63, 69, 149, 206

[56] References Cited

U.S. PATENT DOCUMENTS

| | | | |
|---|---|---|---|
| 4,586,171 | 4/1986 | Fujishima | 365/205 |
| 4,733,374 | 3/1988 | Furuyama et al. | 365/149 X |
| 4,916,661 | 4/1990 | Nawaki et al. | 365/51 |
| 4,977,542 | 12/1990 | Matsuda et al. | 365/207 |

OTHER PUBLICATIONS

IEEE International Solid-State Circuits Conference Feb. 19, 1988; pp. 238-239.

*Primary Examiner*—Joseph A. Popek
*Attorney, Agent, or Firm*—Robert E. Bushnell, Esq.

[57] ABSTRACT

The higher packing cells memory circuit includes a plurality word line drivers employing a plurality of word lines, a plurality of bit lines, and various decoders. Disclosed is the array method of the word line drivers, which can reduce the pitch between the word line drivers by, for example, arranging word lines in a group to provide a cross-over or to twist the word line is not continuously adjacent to the same neighboring word line, so that the layout of the semiconductor memory array may be easily accomplished. Moreover, the array method of other components of the memory array is suggested.

4 Claims, 3 Drawing Sheets

METHOD FOR REDUCING COUPLING NOISE OF WORD LINES IN A SEMICONDUCTOR MEMORY DEVICE

BACKGROUND OF THE INVENTION

The present invention relates to word lines of a semiconductor memory device, more particularly, to a layout method of the semiconductor memory array for reducing word line coupling noise and coupling capacitance between the word lines.

Memory elements or cells of the semiconductor memory device are influenced by the problems which are caused by the layout of higher packing cells memory array, because the semiconductor memory device tends to higher and higher packing cells memory circuit in a minute chip area.

Particularly, in the memory cell array having a plurality of bit lines and a plurality of word lines, narrower pitch between the lines because of its tendency to higher packing cells memory circuit, brings about capacitive couplings between the lines when a signal is transmitted through a line. The capacitive coupling between the lines is doubled by the capacitive component of line itself.

The larger the capacity of the semiconductor memory device is, the longer the length of the word line is, and the narrower the pitch between the word lines is.

However, since the time required to access the memory cell depends upon the length of the word line, the longer word line is undesirable. Accordingly, to compensate for the access time delay, metal layer is formed on polysilicon which is the matter of the word line, so that high speed operation has been possible. Coating the word lines with the metal causes the capacitive coupling between the lines to be larger due to the narrower pitch between the lines.

In other words, noise due to capacitive coupling between the metals is added to noise due to capacitive coupling between lines. Because such noise due to capacitive coupling between the word lines is charged or discharged in case that one word line is selected, this makes it possible to guide a wrong memory operation in high speed operation.

Of course, since miniaturization of the metal oxide semiconductor transistor cell and minutely scaled layout of the memory array according to higher packing cells memory circuit has high level driving voltage to drive the word lines, it is unable to neglect the noise due to the high level driving voltage. Therefore, the method that the driving voltage to drive the word line is lowered to less than 5 volts is adopted in order to remove this noise, but since the transistor requires its own threshold voltage to be operated, the method to lower the driving voltage to drive word line is limited.

The conventional memory array having several problems described above is illustrated in FIG. 1. Referring to FIG. 1, a plurality of bit lines $BL_i$–$BL_j$, a plurality of word lines is arranged across the bit lines, and each pair of bit lines is connected to each sense amplifiers. The memory cells are arranged on the crossing points of the word lines and the bit lines, the memory of the present invention has folded bit lines. In read operation of the memory device, the information being stored in the cell selected by the word line is loaded on the selected bit line, and then sense amplifier selected by the bit line reads the information. At this time, the coupling capacitance between the selected word line and the neighboring word line is illustrated in FIG. 3A. Referring to FIG. 3A, capacitive components will be described according to the memory array of FIG. 1. Coupling capacitances $C_{12}$, $C_{23}$, $C_{34}$, $C_{45}$ between the word lines $WL_1$–$WL_4$, and substrate capacitances $C_1$, $C_2$, $C_3$, $C_4$ of the word lines $WL_1$–$WL_4$ are presented. Therefore, in case that any word line is selected, the voltage of word line coupling noise is:

$$V_{CP} = \frac{C_c}{C_s + C_c} \times V_{WL} \quad (1)$$

($V_{WL}$: driving voltage of the selected word line)

The substrate capacitance Cs of the word line depends on the metal formation of the word line and on the character of the substrate, so that the substrate capacitance Cs may be regarded as the constant. The driving voltage $V_{WL}$ of the word line is the factor to effect the word line coupling noise, but since the driving voltage for driving the word line is at most threshold voltage of the memory cell transistor, the term $V_{WL}$ is neglectable. Therefore, it can be easily understood by the skilled person in the art that the important factor to effect the word line coupling noise is the coupling capacitance Cc.

SUMMARY OF THE INVENTION

Accordingly, it is an object of the present invention to provide the semiconductor memory array for reducing the word line coupling noise during the word line operation.

To achieve one aspect of the object, the memory array of the present invention includes a plurality of word lines, the word lines being divided into several groups, in which each group contains four word lines, and the word lines of each group being twisted with respect to each other so that each word line may not be adjacent to the neighboring word lines.

DETAILED DESCRIPTION OF THE PREFERRED EMBODIMENT

Figure 1:
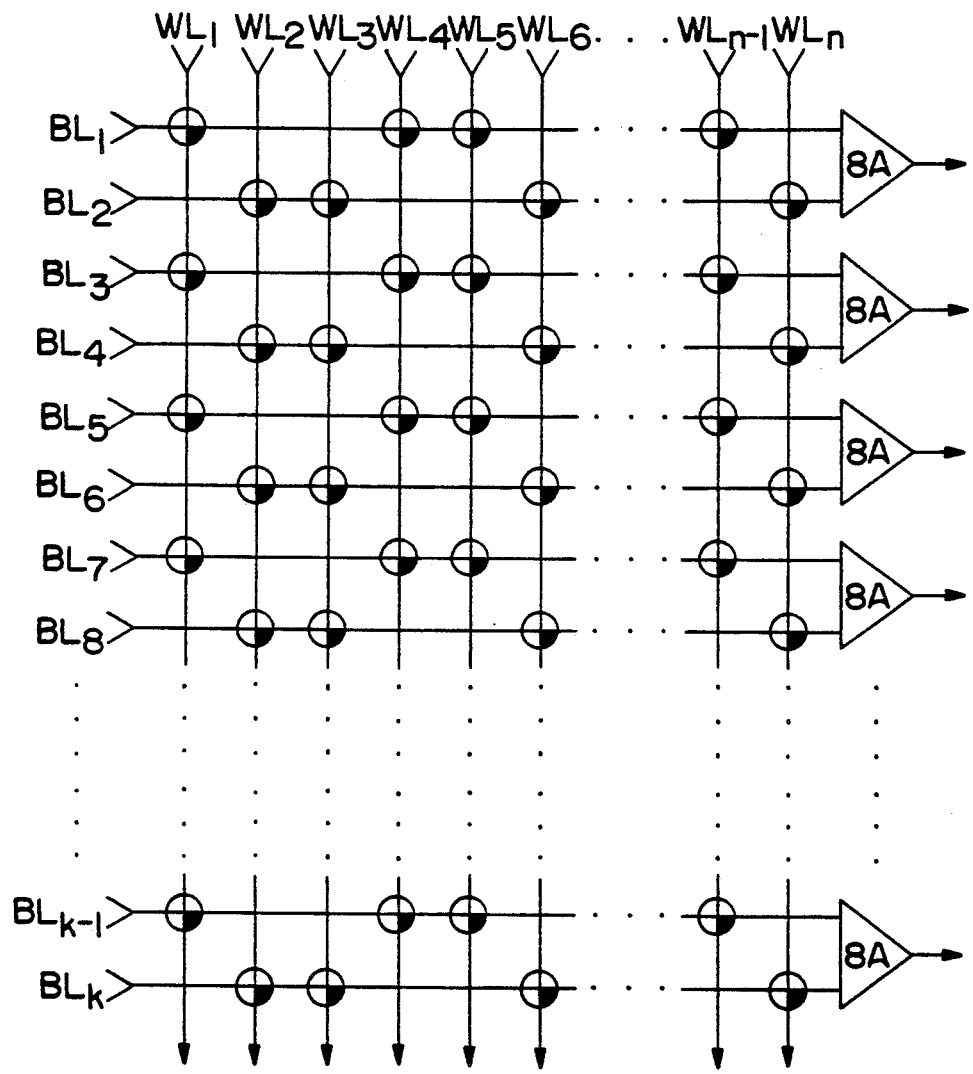
FIG. 1 is a structure of word lines according to a conventional semiconductor memory array.
Figure 2:
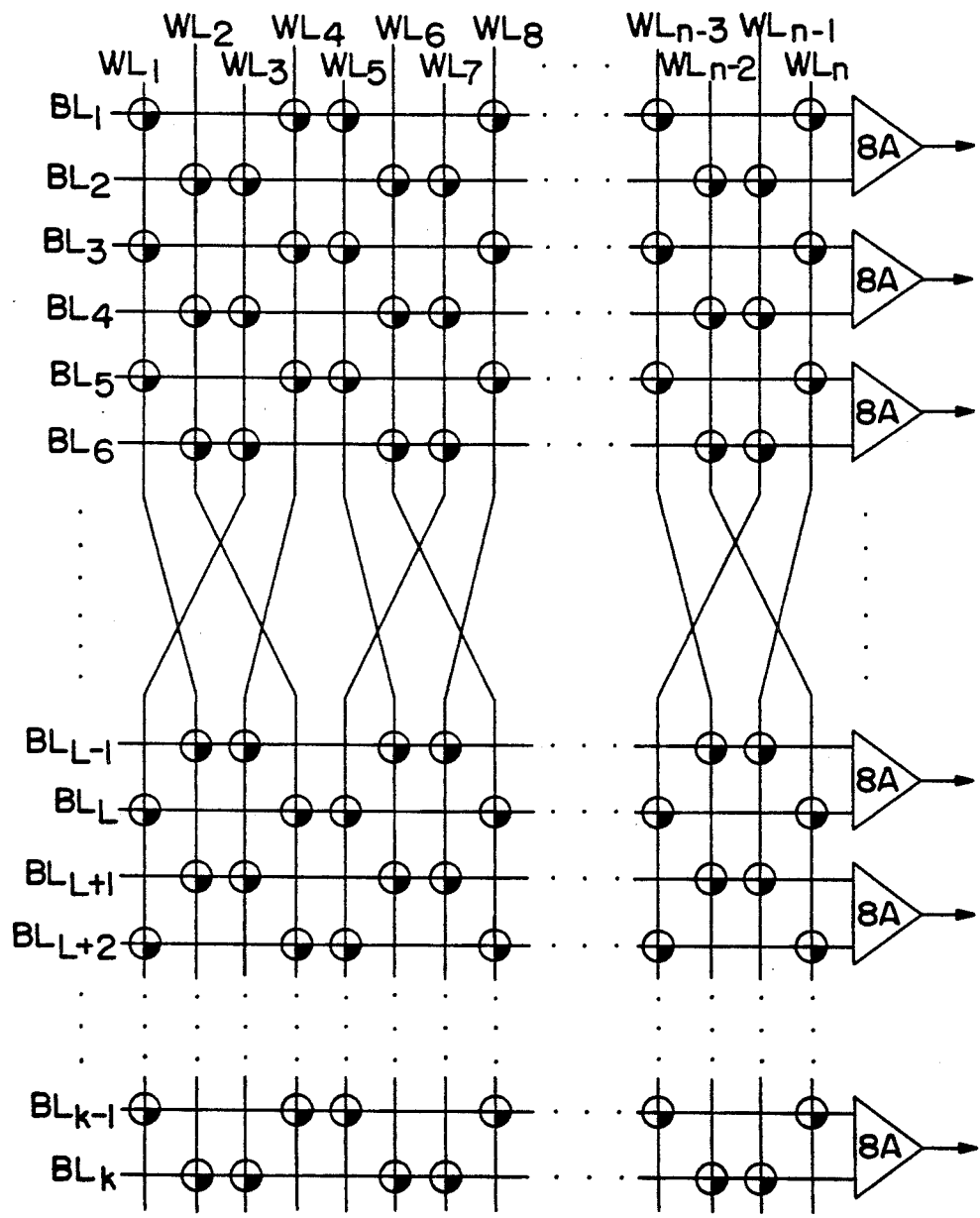
FIG. 2 is a structure of word lines of a semiconductor memory array according to the present invention.
Figure 3A:
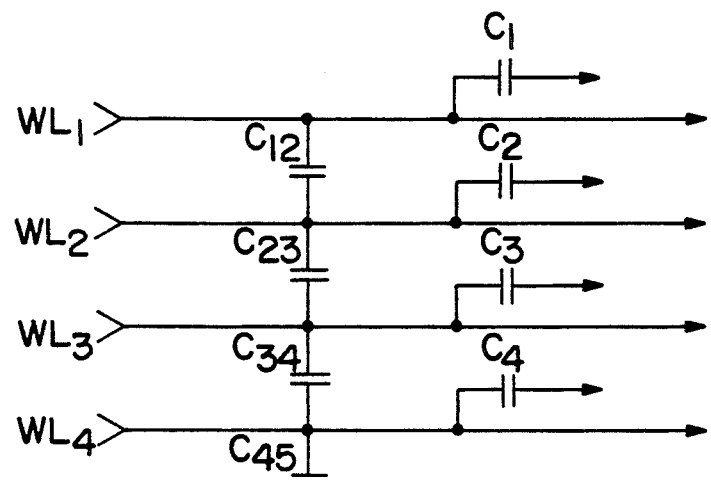
FIG. 3A is a circuit diagram illustrative of word line capacitive components according to FIG. 1.
Figure 3B:
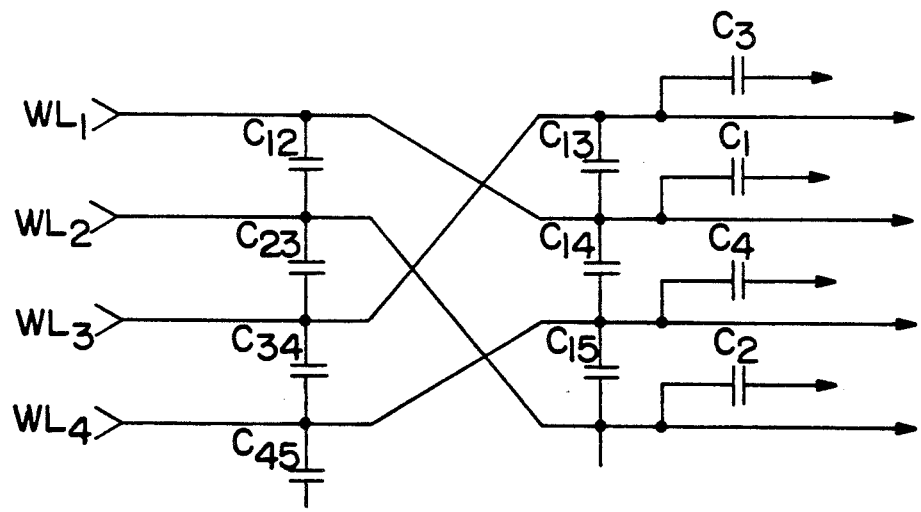
FIG. 3B is a circuit diagram illustrative of word line capacitive components according to FIG. 2.

FIG. 2 illustrates a layout diagram of the memory array according to the present invention, and FIG. 3B shows capacitive components according to the layout of FIG. 2. Referring to FIG. 2, a plurality of bit lines $BL_i$–$BL_j$, each pair of bit lines being connected to each sense amplifier SA, and a plurality of word lines arranged across the bit lines, the word lines being divided into several groups, wherein the word lines of each group containing four word lines are twisted once in the middle area of the word lines, that is, strapping area.

For example, the second word line $WL_2$ is placed between the first word line $WL_1$ and the third word line $WL_3$ before being twisted, but is placed between the fourth word line $WL_4$ and the seventh word line $WL_7$ after being twisted. The third word line $WL_3$ is placed between the first word line $WL_1$ and the second word line WL$_2$, and the first word line WL$_4$ between the first word line WL$_1$, and the second word line WL$_2$, the first word line WL$_1$ between the third word line WL$_3$ and the fourth word line WL$_4$.

On the other hand, since the pitch between the twisted word lines is increased twice, the coupling capacitances between the twisted word lines are decreased by half. The reason is that the word lines are arranged in parallel. The principle that capacitance between parallel plates is inversely proportional to the space between the planes is applied in this case. The area required to twist the word lines is the joint area of the word lines, so that another area required to twist the word lines is not needed. Decrease of the coupling capacitance due to twisting the word lines is expressed by:

$$Cc' = \frac{1}{2} Cs \quad (2)$$

$$V_{CP} = \frac{Cc}{Cs + Cc'} \times V_{WL}$$

(Cc': coupling capacitance of word lines)

The effect to decrease the coupling capacitance is illustrated in FIG. 3.

Therefore, the values of coupling capacitances C'$_{12}$, C'$_{23}$, C'$_{34}$ C'$_{45}$ of FIG. 3B are half than the values of the coupling capacitances C$_{12}$, C$_{23}$, C$_{34}$, C$_{45}$ of FIG. 3A.

Accordingly, as illustrated in the equation (2), since the coupling capacitance Cc' of FIG. 3B is decreased by half as compared with the coupling capacitance Cc of FIG. 3A, the word line coupling noise V$_{CP}$ is also decreased by half.

In the embodiment of the present invention, four word lines belong to each word line driver, but according to the experimental result, in case that more than four word lines twist relative to each other, the word line coupling noise is also decreased, so that as many word lines as required can twist each other.

Moreover, the inventive method can be acceptable for buses having more than four input/output lines in the semiconductor memory device, for instance, the input/output lines and the data buses of column address decoders and row address decoders as well as the word lines.

In the embodiment of the present invention, the layout method of the word line drivers is described, but the row address decoders and the column address decoders can be arranged in the layout method of the present invention.

As described hereinabove, the present invention has another advantage in that the word line coupling noise due to the word line operation is reduced by twisting the word lines in the strapping area.

What is claimed is:

1. In a semiconductor memory device having a plurality of word lines, said semiconductor memory device characterized in that said word lines are divided into several groups, wherein each group has at least four word lines, and wherein said word lines remain in a respective one of said groups, said word lines being disposed to cross each other at a predetermined location so that each word line is not continuously adjacent to any of its neighboring word lines, said predetermined location being the same for each group.

2. The semiconductor memory device of claim 1, wherein said word lines are disposed to cross in a strapping area of said semiconductor memory device.

3. The semiconductor memory device of claim 1, wherein said lines are disposed to cross in more than two locations of said semiconductor memory device so that each word line is not continuously adjacent to said neighboring word lines, said locations being the same for each group.

4. A semiconductor memory array comprising:
a plurality of pairs of bit lines; and
a plurality of groups of word lines;
said semiconductor memory array characterized in that said plurality of pairs of bit lines do not cross and remain adjacent to each other;
said semiconductor memory array characterized further in that each group of said plurality of groups of word lines has at least four word lines, at least four word lines in each group being twisted across each other in a strapping area of said semiconductor memory array so that each of at least four word lines is not continuously adjacent to any neighboring word line, wherein at least four word lines remain in a respective one of said groups of word lines.

* * * * *